(12) United States Patent
Wang et al.

(10) Patent No.: US 7,496,120 B2
(45) Date of Patent: Feb. 24, 2009

(54) COMPACT LASER OUTPUT MONITORING USING REFLECTION AND DIFFRACTION

(75) Inventors: Tak Kui Wang, Saratoga, CA (US); Christopher L. Coleman, Santa Clara, CA (US)

(73) Assignee: Avago Technologies Fiber IP (Singapore) Pte. Ltd., Singapore (SG)

( * ) Notice: Subject to any disclaimer, the term of this patent is extended or adjusted under 35 U.S.C. 154(b) by 144 days.

(21) Appl. No.: 11/251,346

(22) Filed: Oct. 14, 2005

(65) Prior Publication Data

US 2007/0091299 A1 Apr. 26, 2007

(51) Int. Cl.
*H01S 3/10* (2006.01)
*H01S 3/13* (2006.01)

(52) U.S. Cl. .............. 372/29.02; 372/29.021; 372/31; 372/32; 372/33

(58) Field of Classification Search .......... 372/29.02, 372/29.021, 31–33
See application file for complete search history.

(56) References Cited

U.S. PATENT DOCUMENTS

| | | | |
|---|---|---|---|
| 5,032,219 A | 7/1991 | Buchmann et al. | |
| 5,995,692 A | 11/1999 | Hamakawa et al. | |
| 6,417,107 B1 | 7/2002 | Sekimura | |
| 6,862,301 B2 * | 3/2005 | Cox | 372/20 |
| 6,895,147 B2 | 5/2005 | Posamentier | |
| 2001/0026563 A1 * | 10/2001 | Yagi | 372/15 |
| 2001/0026574 A1 * | 10/2001 | Yagi | 372/102 |
| 2003/0123495 A1 * | 7/2003 | Cox | 372/20 |

* cited by examiner

*Primary Examiner*—Evan Pert

(57) ABSTRACT

Compactness is preserved while enabling beam monitoring of optical properties of an output beam by employing a combination of reflection and diffraction. An input beam is reflected, divided using reflection/diffraction, and re-reflected. As a consequence, both a light source and one or more beam monitoring detectors may be disposed along a single side of an optical module. In one embodiment, an input beam is introduced from a first side of an optical module, is reflected by a 45 degree mirror, and is divided by a diffraction grating which redirects a minor portion of the beam energy back to the 45 degree mirror. Following the second reflection from the mirror, the returned portion of the beam is used to measure one or more optical properties.

18 Claims, 3 Drawing Sheets

US 7,496,120 B2

COMPACT LASER OUTPUT MONITORING USING REFLECTION AND DIFFRACTION

BACKGROUND ART

In many optical applications, modules are used to couple a light source to an optical fiber. The module may include one or more lenses that promote efficient coupling between the optical fiber and the light source. The light source may be formed of a succession of thin films on a semiconductor substrate, so as to define a Vertical Cavity Surface Emitting Laser (VCSEL). A VCSEL is a surface emitting laser. Another type of semiconductor laser used in telecommunications applications is referred to as an edge emitting laser, which may be further divided into subtypes that include Fabry Perot (FP) and Distributed Feedback (DFB) lasers.

Particularly within the field of data communications via optical signals, consistency with respect to certain optical properties is important in assuring proper operations. The power output (i.e., the light intensity) must remain above a predetermined level. The wavelength of the signal may also be significant. Various factors will cause changes in the optical properties. For example, a change in the temperature of the environment in which a laser diode resides will affect the laser emission wavelength. As another example, the bias current of the laser controls its output power. The aging of a laser diode also may affect its power output.

Techniques for monitoring and controlling properties of an output beam are known. FIG. 1 shows a prior art approach to monitoring and controlling an output beam of an edge emitting laser diode 10. The diode is shown as being mounted on a substrate 12. The laser diode emits an output beam 14 from a front facet 16 and emits a monitoring beam 18 from a rear facet 20. The output beam may be directed through optics 22, such as a lens which provides beam collimation. The beam is reflected by a 45 degree mirror 24 to an optical fiber 26 that has an optical axis perpendicular to the substrate 12. The 45 degree mirror may be used for applications in which the desired orientation of the beam from an edge emitting laser is to be the same as the conventional output beam orientation of a module that uses VCSELs.

Within the path of the monitoring beam 18 from the rear facet 20 of the edge emitting laser 10 is a detector 28 that generates a signal indicative of power. Because there is a known ratio between the power of the output beam 14 and the power of the monitoring beam, the signal from the detector may be used to identify the output power to the fiber 26. The electrical signal from the detector is directed to a controller 30 that is able to adjust the bias current of the laser 10. Thus, the signal from the detector provides feedback for maintaining the laser in a constant output power state. While not shown, the controller may also receive a signal from a temperature sensor. Then, the controller may adjust operations of a thermo-electric cooling (TEC) device or a heating device.

While the monitoring and controlling techniques described with reference to FIG. 1 operate well for their intended purpose, there are concerns. For example, the known ratio of the power of the two beams 14 and 18 is less reliable with respect to maintaining the output power to the fiber 26 if the output beam 14 is manipulated in a manner different than the monitoring beam 18. For example, in an Externally Modulated Laser (EML), the modulation which occurs for telecommunications or other applications does not affect the monitoring beam 18. Thus, a feedback signal from the detector 28 will not show all fluctuations of output power to the fiber.

SUMMARY OF THE INVENTION

In accordance with the invention, a combination of reflection and diffraction is used to cause a monitoring beam portion to substantially retrace (subtend) angles followed by an input beam for which monitoring is of interest. An optical monitoring system includes a beam input that defines an input segment of a beam path. A reflection-inducing structure positioned along the input beam segment reflects light from the input beam segment to a reflected beam segment. A diffraction-inducing structure positioned along the reflected beam segment diffracts a minor portion of the light, so as to return to the reflection-inducing structure. The minor portion is again reflected and is directed to a detector which generates a signal indicative of an optical property of this diffracted and reflected beam portion. The major portion of the light energy is not reflected by the diffraction-inducing structure, but instead exits as the output beam.

In one embodiment, the optical monitoring system is formed as an optical module. A front side of the optical module includes a beam input and at least one beam monitor output. An internal mirror has a substantially 45 degree angle relative to the front side. The internal mirror is positioned to be impinged by a beam propagated through the beam input. A lid of the optical module is substantially transparent with respect to the beam, so as to enable passage of the output beam to an optical fiber or the like. However, a diffractor is disposed within the output path of the beam in order to reflect the minor portion, which again impinges the internal mirror. The diffractor in effect optically couples the diffracted portion to each beam monitor output via the reflection at the internal mirror. A detector may be aligned with each beam monitor output.

A method in accordance with the invention includes receiving the input beam, reflecting the input beam, transmitting a major portion of the reflected beam as an output signal and diffracting a minor portion such that a monitoring beam portion is directed rearwardly, reflecting the monitoring beam portion so as to subtend generally the same angle as the input beam, and detecting at least one optical property of the monitoring beam portion.

In a power monitoring application, a single detector, such as an edge detector, may be aligned with a single beam monitor output at the front side of the module. The detector generates a signal indicative of the intensity of the diffracted portion of the original input beam, which may be generated by an edge emitting laser mounted on a same substrate as the edge detector. The signal may be used to determine the intensity of the output beam and to provide feedback control to maintain a constant output power. Alternatively, in a wavelength-locking application, two detectors may be used. The first detector may monitor total power of the output beam as in the power monitoring application. A second detector is aligned with the second beam monitoring output at the front side of the module and is configured to generate a signal that is strongly dependent on wavelength. For example, a wavelength-specific filter may be positioned in the path to the second detector. The output of the second detector may be used to control the wavelength of the light source. As one possibility, the wavelength control may be provided by dynamically adjusting the temperature of a laser that is used as the light source. The relationship between temperature and the emitted wavelength of a laser is known. Thus, the wavelength and power of a laser can be controlled by adjustments to the temperature and bias current of the laser. For an edge emitting laser, the "feedback" is determined from the front facet emission, rather than from light emission from the rear facet of the edge emitting laser.

DETAILED DESCRIPTION

Figure 1:
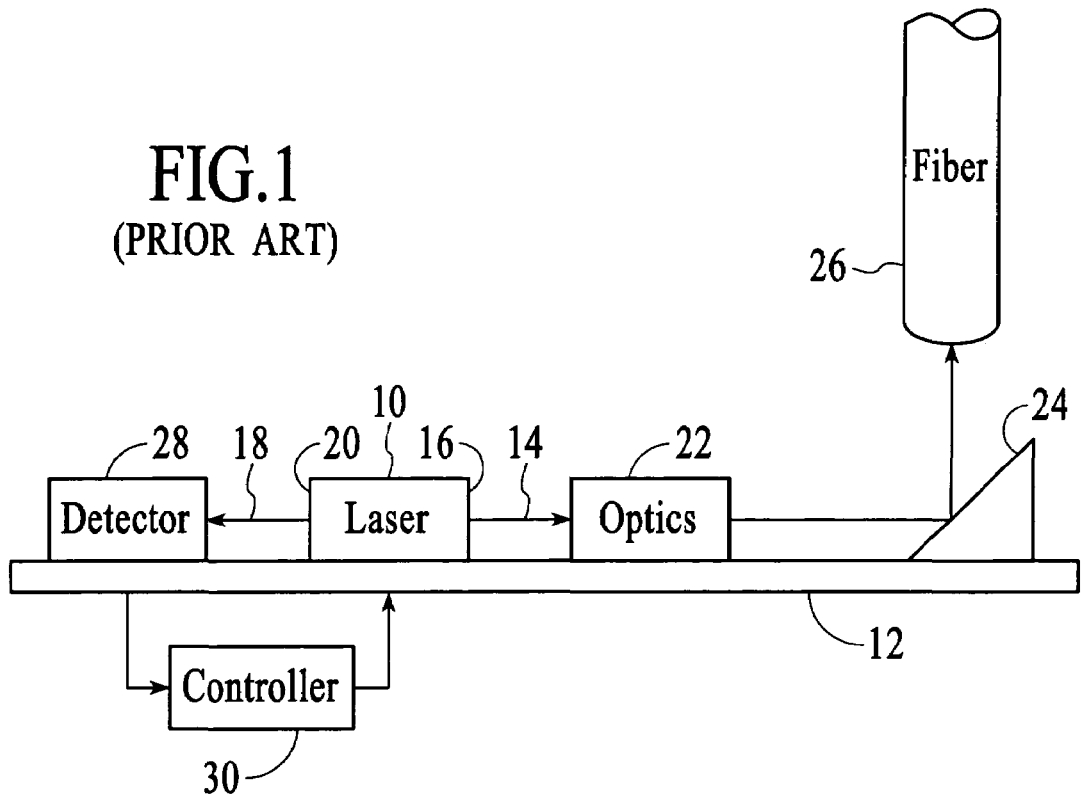
FIG. 1 is a cross sectional representation of a prior art optical arrangement for monitoring and controlling power of a beam output.
Figure 2:
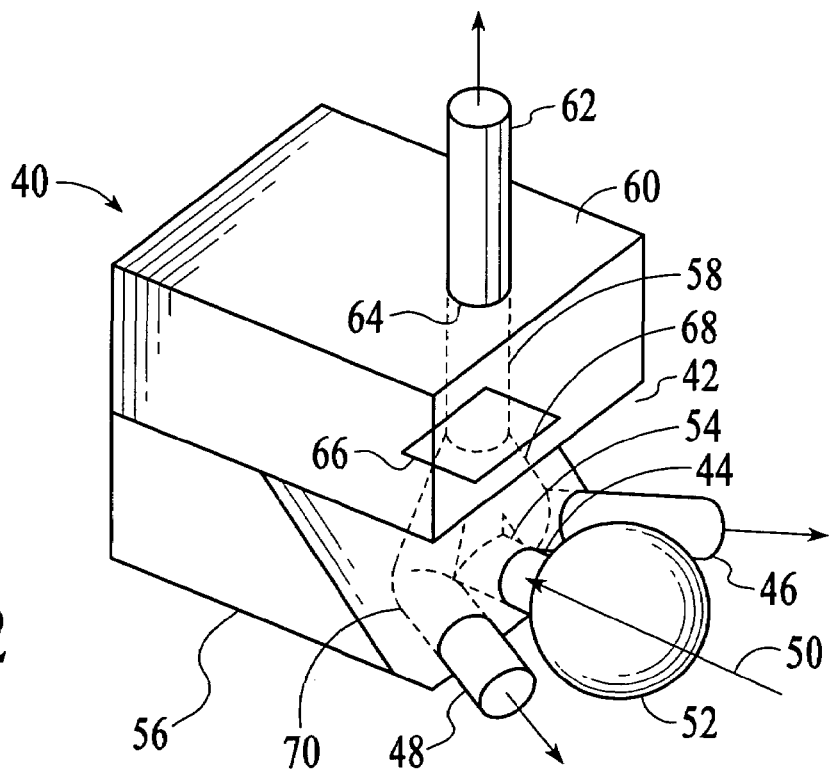
FIG. 2 is a perspective view of a module in accordance with one embodiment of the invention.

FIG. 2 shows one embodiment of an optical module 40 that enables feedback control of either or both of output power and emission wavelength (or other beam property), while retaining generally the same size requirements as a module without such a capability. Compactness is maintained by employing a combination of reflection and diffraction. In the embodiment shown in FIG. 2, a front side 42 of the module includes a beam input 44 and a pair of beam monitor outputs 46 and 48. Typically, the front "side" is not defined by structure, since even a transparent component would have an effect on beam propagation (i.e., refraction). Rather, the optical elements for directing and redirecting light define the positions of the input and the outputs. Moreover, the components of FIG. 2 may be only a subset of components of a more complete module, such as one that includes electrical components. The invention is considered to be well suited for use for a module that houses the components of FIG. 2 and the light source 12, as well as a light source and at least one detector.

A light source, such as a laser, emits an input beam 50 that is collimated by a ball lens 52. In other embodiments, the collimation is achieved using alternative means, such as other types of optical devices. The light source can be an edge emitting laser that is mounted on a substrate that supports the ball lens and other components of FIG. 2. The input beam 50 then represents the emission from the front facet of the laser.

Following the collimation of the input beam 50 by the ball lens 52, the light follows an input beam segment 54 of the path through the module 40. A 45 degree mirror 56 is positioned such that the light is reflected upwardly to a reflected beam segment 58 of the path through the module.

The reflected beam segment 58 of the beam path passes through a lid structure 60. For embodiments in which the 45 degree mirror 56 and lid are housed in common with other optical and electrical components of a more complete module, the lid may be easily held at a fixed but spaced-apart position relative to the mirror 56. The lid structure is transparent to the wavelength of the light source, so as to allow an output beam 62 to exit at an output 64 of the module 40. As one possibility, the lid structure may be a silicon substrate for beam wavelengths of longer than 1 μm. While not shown, a lens may be placed at the output 64 of the module. The lens may be used to focus the beam 62 onto an optical fiber or other element.

Within the beam path through the module 40 is a diffraction-inducing structure 66, such as a diffraction grating. While the major portion of the input beam 50 propagates through the diffraction grating, a minor portion is directed rearwardly for a second reflection from the 45 degree mirror 56. In the embodiment of FIG. 2, first and second diffracted beam portions 68 and 70 are reflected by the mirror for exit via the beam monitoring outputs 46 and 48, respectively. In other embodiments, a single diffracted beam portion is utilized for optical monitoring. Also in the embodiment of FIG. 2, the 45 degree mirror is shown as a continuous structure. In other embodiments, the mirror may be segmented such that the input beam and the diffracted portions are directed to different segments.

Each diffracted beam portion 68 and 70 is reflected at an angle on the basis of Bragg's diffraction law. As is known to persons skilled in the art, the power of the reflected light depends upon the incident beam power and the design of the grating. When using a grating, more than one beam of diffracted light will be reflected, as shown in FIG. 2. In the design of the grating, care should be taken to ensure that reflected power back to the laser is less than that which might affect operation of the laser. Lamellar gratings and blaze gratings are two of the available options.

Figure 3:
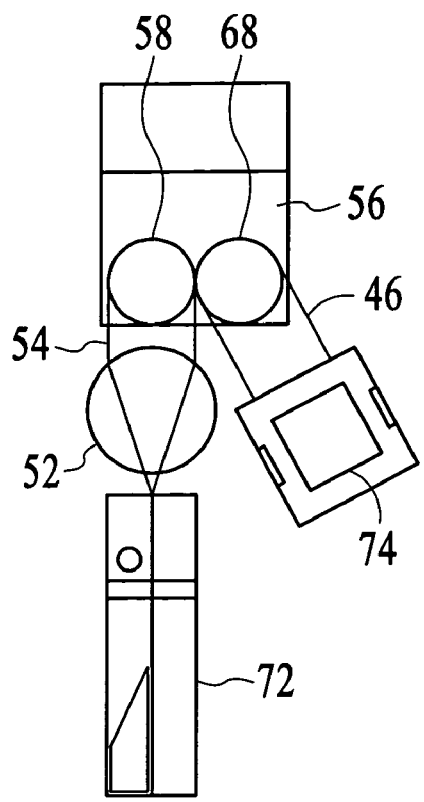
FIG. 3 is a top view of the use of the present invention in a power monitoring application.

FIG. 3 illustrates an embodiment for monitoring power. A laser 72 directs an input beam through the ball lens 52, which provides beam collimation. The input beam may be emitted from a front facet of an edge emitting laser. The light travels along the input beam segment 54 of the beam path and is reflected by the 45 degree mirror 56 upwardly along a reflected beam segment 58. As described with reference to FIG. 2, the major portion of the beam provides the output, but a minor portion is reflected by the diffraction-inducing structure to provide the diffracted beam portion 68 shown in FIG. 3. This beam portion is again reflected by the 45 degree mirror to the beam monitor output 46. The axis of the beam monitor output is generally along the same horizontal plane as the axis of the input beam. That is, the axis is parallel to the base of the 45 degree mirror. The beam portion from the diffraction-inducing structure subtends the same angles as the original beam, but with the Bragg's diffraction angle. Therefore, a monitoring device, such as an edge detector 74 mounted on the same substrate as the mirror and the laser, can be aligned to collect the energy of the diffracted beam portion. The intensity of the diffracted beam portion is dependent upon the intensity of the input beam from the laser 72. Therefore, the signal generated by the monitoring device can be used to control the laser so as to maintain a constant intensity. For example, the bias current of the laser may be dynamically adjusted on the basis of the signal from the monitoring device.

Because the input beam is collimated following passage through the ball lens 52, the beam can undergo multiple reflections and can propagate along a long path without losing significant intensity. Only a small diffraction angle is required, so that a diffraction grating may have a long period, thereby easing manufacturing requirements. Additionally, because the beam monitor output 46 is generally parallel to the base of the mirror, an edge detector monitor 74 can be used.

While the diffraction-inducing structure for dividing the input beam has been described as being a diffraction grating, other approaches to partially reflecting the input beam may be used.

Figure 4:
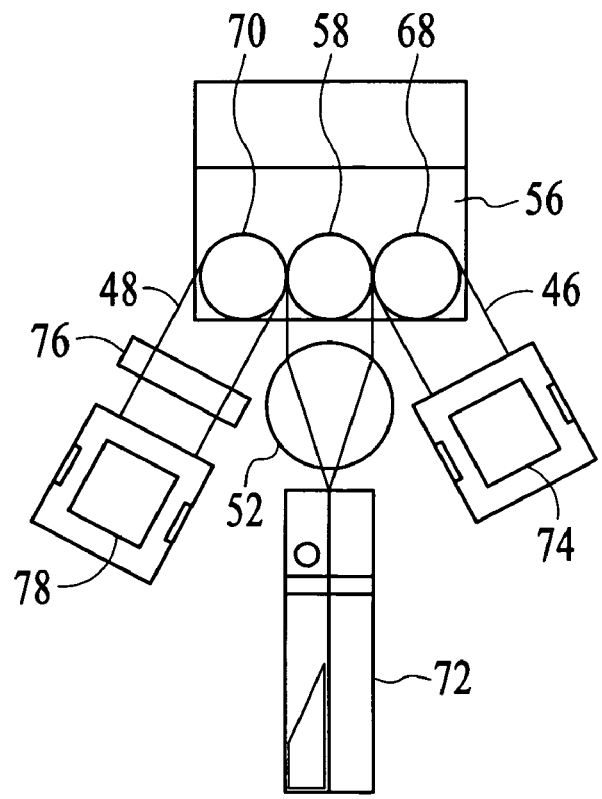
FIG. 4 is a top view of the use of the present invention in a wavelength-locking application.

FIG. 4 shows another application of the invention. For each of the applications of FIGS. 3 and 4, the illustrated optical and electrical components may be housed in a single module and can be mounted along a surface of a single substrate. In the application of FIG. 4, wavelength locking is enabled. Both of the diffracted beam portions 68 and 70 of FIG. 2 are utilized.

Thus, the beam along the reflected beam segment 58 is divided into the output beam and a pair of smaller intensity monitor beams 46 and 48. The first monitoring device 74 operates in the same manner as described with reference to FIG. 3. Thus, the total power emitted by the laser 72 may be monitored. The second beam monitor output 48 has an optical path that passes through a filter 76 before reaching a second monitoring device 78. If the filter is wavelength-specific, the output of the second monitoring device will have an intensity that is strongly dependent on wavelength. The monitoring devices 74 and 78 may be edge detectors that generate signals that are responsive to changes in intensity. In this configuration, the output of the first edge detector is used to control total emitted power by dynamically adjusting the bias current of the laser 72. The output of the second edge detector 78 is used to control the wavelength of the laser. As one possibility, wavelength control is achieved by dynamically adjusting the temperature of the laser. Since the emitted wavelength of the laser is varied by changes in the operating temperature, the emission wavelength can be locked by the combination of controlling laser output using the measurements by the first edge detector 74 and controlling laser temperature using the output of the second edge detector 78.

Figure 5:
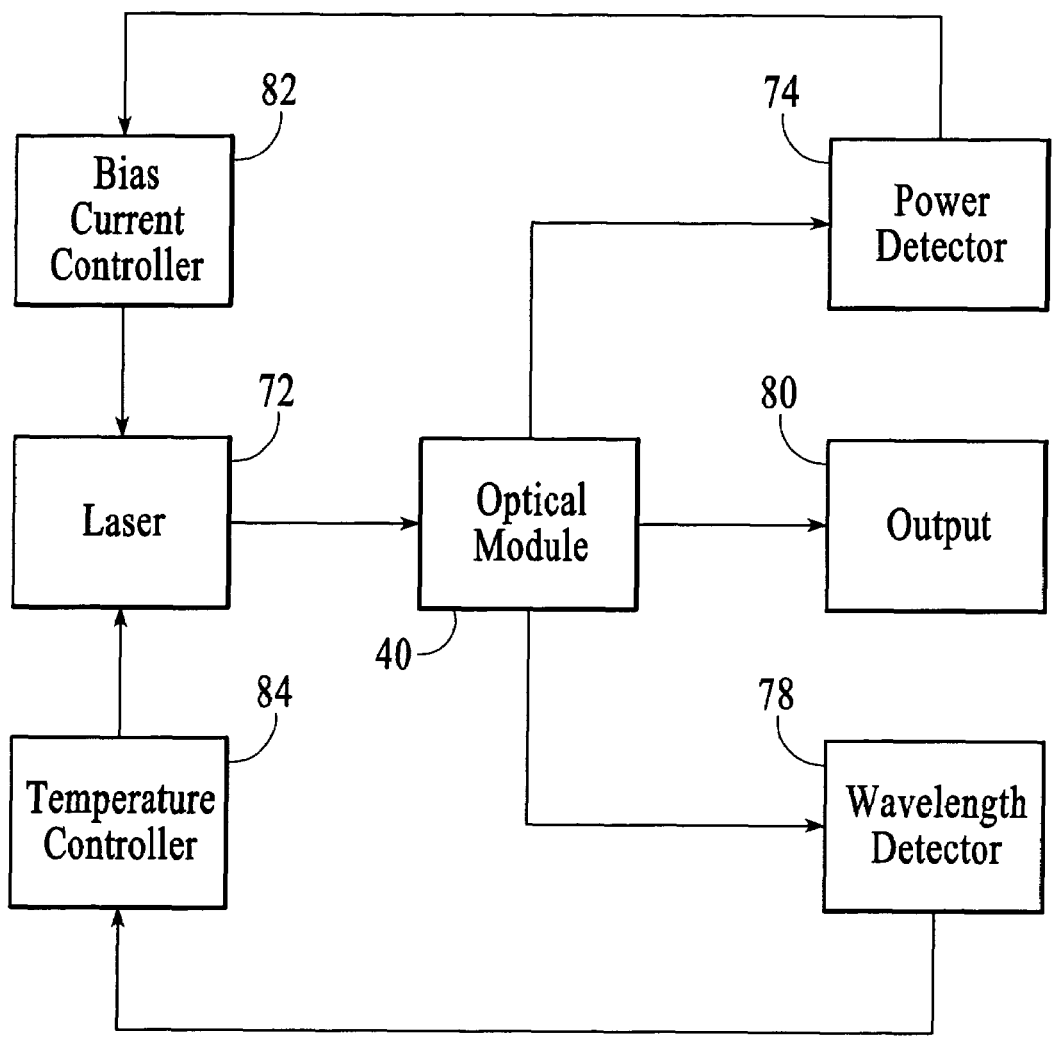
FIG. 5 is a block diagram of components for enabling dynamic adjustments of optical properties of an output beam in accordance with the invention.

FIG. 5 is a block diagram of components for implementing the invention of FIGS. 2 and 4. The laser 72 provides an input beam to the optical module 40. The combination of diffraction and reflection divides the input beam between an output to an output device (such as an optical fiber) and a pair of lower intensity beam monitor outputs. One beam monitor output is directed to a power detector, such as an edge detector, which generates signals indicative of laser output power. The signals from the detector 74 are used by a bias current controller 82 to maintain a constant intensity of the laser output. The second monitor beam is received by the wavelength detector 78. As in FIG. 4, a filter 76 may be used to ensure that the output of the detector 78 is strongly dependent upon an optical property at a specific wavelength. The output of the wavelength detector is used by a temperature controller 84 to regulate the temperature of the environment in which the laser resides. Therefore, the temperature can be adjusted to ensure that the wavelength of the laser emission is locked.

While the optical module 40 is shown as being separate from the laser 72, and the detectors 74 and 78, the components may be housed in common. Thus, the lid of the optical module may form a portion of a hermetical seal for the laser and the detectors. Signals generated by the detectors within the housing could be output to the controllers 82 and 84. However, there are advantages to providing the controllers within the same housing, so that all of the components are integrated. Thus, with a heating element, such as a resistor within the housing, the environment in which the laser (e.g., an Externally Modulated Laser (EML)) resides may be easily controlled. Similarly, persons skilled in the art would readily recognize means for controlling the bias current of the laser. For an embodiment in which the laser is an EML, the light that is monitored is the light emission from the front facet and after the modulation, so that there is a greater accuracy than would be achieved by monitoring emission from the rear facet.

Where all of the components shown in FIG. 5 either define or are contained within a single housing, the housing can be compact as a result of the above-described combination of reflection and diffraction. In another embodiment, a single hermetically sealed housing is used for multiple channels. Thus, there is a separate laser for each channel, as well as a separate power detector 74 for each laser 72. Moreover, separate temperature control is provided for each channel. Identically formed lasers will emit at substantially the same wavelength, but can be induced to emit at the different wavelengths of the various channels by individually setting the temperatures of the lasers. The different wavelengths/channels can then be combined and transmitted over a single fiber, so as to greatly increase the bandwidth of data transmission via the fiber.

What is claimed is:

1. An optical monitoring system comprising:
   a beam input that defines an input beam segment of a beam path along a first axis;
   a reflection-inducing structure positioned along said input beam segment having a non-transmissive, reflective surface intercepting the first axis to reflect a light beam from said input beam segment to a reflected beam segment of said beam path along a second axis;
   a diffraction-inducing structure positioned along said reflected beam segment and intercepting said second axis to redirect a minor portion of said light beam along a third axis back toward said non-transmissive, reflective surface of said reflection-inducing structure to define a diffracted beam portion reflected from the surface, said diffraction-inducing structure being configured to enable a major portion of said light beam to pass to an output beam segment of said beam path along said second axis, thereby defining an output portion and a diffracted beam portion of said light beam; and
   a detector positioned relative to said reflection-inducing structure to generate a signal indicative of an optical property of said diffracted beam portion.

2. The optical monitoring system of claim 1 wherein said detector and said reflection-inducing structure are aligned such that a monitoring beam path from said reflection-inducing structure to said detector has an optical axis that is substantially coplanar with an optical axis of said input beam segment of said beam path.

3. The optical monitoring system of claim 2 wherein said optical axes of said monitoring beam path and said input beam segment are adjacent each other.

4. The optical monitoring system of claim 1 wherein said reflection-inducing structure includes at least one mirror oriented at approximately 45 degrees relative to an optical axis of said input beam segment, such that said diffracted beam portion of said light beam follows a return path to said reflection-inducing structure.

5. The optical monitoring system of claim 1 wherein said detector generates said signal to be responsive to variations in optical power of said diffracted beam portion.

6. The optical monitoring system of claim 5 further comprising a second detector positioned relative to said reflection-inducing structure to receive a part of the energy of said diffracted beam portion, said second detector being configured to provide a signal indicative of intensity at a specific wavelength.

7. The optical monitoring system of claim 1 wherein said beam input includes a ball lens for providing collimation for an input light beam.

8. The optical monitoring system of claim 1 wherein said diffraction-inducing structure includes grating.

9. The optical monitoring system of claim 1 wherein said reflection-inducing and diffraction-inducing structures are oriented such that a path of said diffracted beam portion subtends generally the same angles to said detector as said light beam from said beam input to said diffraction-inducing structure.

10. An optical module having monitoring capability comprising:
- a front side having a beam input and at least one beam monitor output;
- an internal mirror having a non-transmissive, reflective surface disposed at a substantially forty-five degree angle relative to said front side, said internal mirror being positioned to be impinged by a beam propagated along a first axis through said beam input;
- a lid that is substantially transparent with respect to said beam to enable passage of an output beam, said lid being positioned within an output path along a second axis of said beam which has impinged and been reflected by said surface of said internal mirror; and
- a diffractor disposed within said output path and intercepting said second axis to redirect a portion of said beam which has impinged said internal mirror such that a diffracted portion is redirected along a third axis back to said non-transmissive, reflective surface of said internal mirror, wherein said diffractor provides optical coupling of said diffracted portion to each said beam monitor output via reflection at said internal mirror.

11. The optical module of claim 10 further comprising a ball lens at said beam input of said front side.

12. The optical module of claim 10 wherein said diffractor includes a diffraction grating along a surface of said lid.

13. The optical module of claim 10 wherein a first said beam monitor output is aligned with a detector for generating a signal indicative of power and wherein a second said beam monitor output is aligned with a detector for generating a signal indicative of a particular wavelength.

14. A method of providing optical monitoring comprising:
receiving an input beam;
reflecting said input beam to a reflected beam path segment by said input beam impinging a non-transmissive, reflective surface, thereby directing a reflected beam along said reflected beam path segment;
transmitting a major portion of said reflected beam as an output signal;
diffracting a minor portion of said reflected beam such that a monitoring beam portion is directed in alignment with said reflected beam path segment;
reflecting said monitoring beam portion from said non-transmissive reflective surface so as to subtend generally the same angle as said input beam; and
detecting optical properties of said monitoring beam portion following said reflecting of said monitoring beam portion.

15. The method of claim 14 wherein detecting said optical properties includes determining optical power of said monitoring beam portion.

16. The method of claim 15 wherein detecting said optical properties further includes generating a second determination of power as a function of wavelength.

17. The method of claim 16 further comprising controlling output power of a source of said input beam based on said detecting.

18. The method of claim 17 further comprising providing wavelength locking of said source of said input beam based on said second determinations.

* * * * *